United States Patent
Ueyama

(10) Patent No.: US 9,655,266 B2
(45) Date of Patent: May 16, 2017

(54) MOUNTING MEMBER AND SOCKET FOR ELECTRIC COMPONENT

(71) Applicant: ENPLAS CORPORATION, Kawaguchi (JP)

(72) Inventor: Yuki Ueyama, Kawaguchi (JP)

(73) Assignee: ENPLAS CORPORATION, Kawaguchi (JP)

( * ) Notice: Subject to any disclaimer, the term of this patent is extended or adjusted under 35 U.S.C. 154(b) by 0 days.

(21) Appl. No.: 15/025,101

(22) PCT Filed: Sep. 22, 2014

(86) PCT No.: PCT/JP2014/075067
§ 371 (c)(1),
(2) Date: Mar. 25, 2016

(87) PCT Pub. No.: WO2015/046139
PCT Pub. Date: Apr. 2, 2015

(65) Prior Publication Data
US 2016/0242306 A1 Aug. 18, 2016

(30) Foreign Application Priority Data

Sep. 27, 2013 (JP) .................. 2013-202221

(51) Int. Cl.
*H01R 13/64* (2006.01)
*H05K 7/10* (2006.01)
*H05K 1/18* (2006.01)

(52) U.S. Cl.
CPC ............. *H05K 7/1069* (2013.01); *H05K 1/18* (2013.01)

(58) Field of Classification Search
CPC ............ H01R 12/7035; H01R 13/6595; H01R 23/7021; H01R 13/73
(Continued)

(56) References Cited

U.S. PATENT DOCUMENTS 4,655,517 A * 4/1987 Bryce .................... H01R 12/58
411/510
4,776,811 A * 10/1988 Humphrey ......... H01R 12/7052
439/378
(Continued)

FOREIGN PATENT DOCUMENTS

JP 44-19732 8/1969
JP 7-51470 2/1995
(Continued)

OTHER PUBLICATIONS

International Search Report mailed Oct. 21, 2014, in corresponding International Application No. PCT/JP2014/075067.

*Primary Examiner* — Abdullah Riyami
*Assistant Examiner* — Thang Nguyen
(74) *Attorney, Agent, or Firm* — Staas & Halsey LLP

(57) ABSTRACT

To improve a seating property of a mounting member with respect to a supporting member and enhance the positional accuracy of the mounting member. The mounting member has a protruding portion that protrudes from a support face of a frame body, and a shaft body that is thinner than the protruding portion. At a base portion of the shaft body, a relief recess is formed over the entire circumference of a boundary region with the protruding portion, and a supported face of the protruding portion is configured so as to contact with a support face of the frame body in a state in which the mounting member is supported by the frame body. In a preferred embodiment of the present invention, the mounting member is used as a guide pin of a floating plate that accommodates an IC socket.

4 Claims, 5 Drawing Sheets

(58) Field of Classification Search
USPC .......................................... 439/571, 567, 378
See application file for complete search history.

(56) References Cited

U.S. PATENT DOCUMENTS

| | | | | |
|---|---|---|---|---|
| 5,254,016 | A * | 10/1993 | Ganthier | H01R 12/714 |
| | | | | 411/339 |
| 5,322,452 | A * | 6/1994 | Mosquera | H01R 12/7064 |
| | | | | 439/567 |
| 5,535,100 | A * | 7/1996 | Lubahn | G06F 1/184 |
| | | | | 361/752 |
| 5,795,177 | A * | 8/1998 | Hirono | G11B 33/126 |
| | | | | 439/157 |
| 5,800,209 | A * | 9/1998 | Suzuki | H01R 12/7047 |
| | | | | 439/571 |
| 9,017,081 | B2 * | 4/2015 | Ueyama | H01R 12/7076 |
| | | | | 439/64 |
| 2004/0087202 | A1 * | 5/2004 | Baccei | H01R 13/6278 |
| | | | | 439/378 |
| 2006/0030196 | A1 * | 2/2006 | Sasame | H01R 13/629 |
| | | | | 439/378 |
| 2010/0304588 | A1 * | 12/2010 | Costabel | F16B 5/0628 |
| | | | | 439/152 |
| 2011/0256753 | A1 * | 10/2011 | Gulla | H01R 12/91 |
| | | | | 439/378 |

FOREIGN PATENT DOCUMENTS

| | | | | |
|---|---|---|---|---|
| JP | H07-51470 | * | 2/1995 | ............ B26B 13/28 |
| JP | 2013-134854 | | 7/2013 | |

* cited by examiner

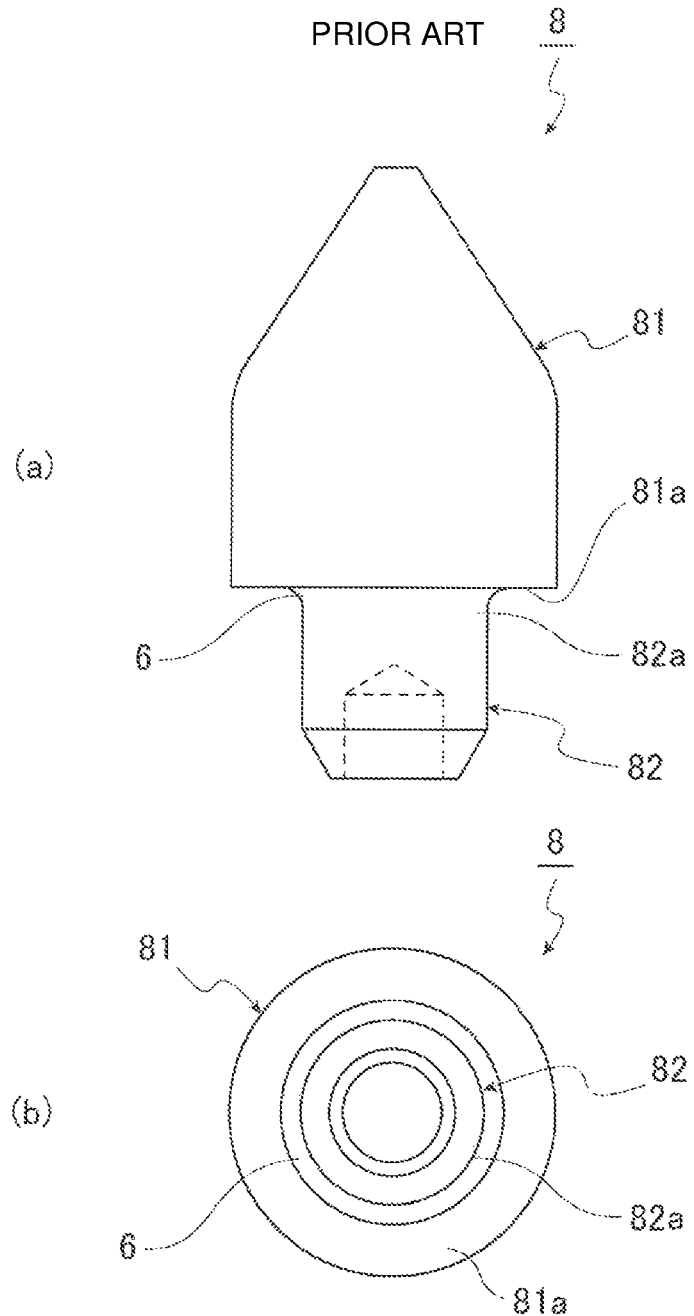

FIG.5
PRIOR ART
(a)
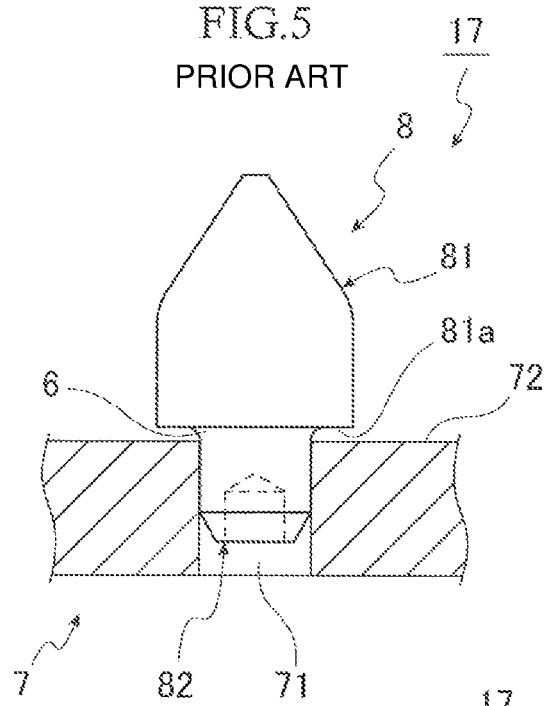
(b)
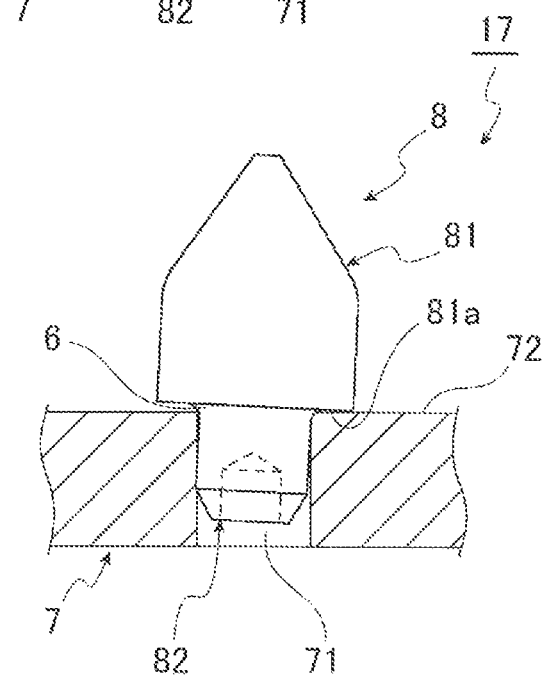

MOUNTING MEMBER AND SOCKET FOR ELECTRIC COMPONENT

CROSS-REFERENCE TO RELATED APPLICATIONS

This application is a U.S. National Stage Application, which claims the benefit under 35 U.S.C. §371 of PCT International Patent Application No. PCT/JP2014/075067, filed Sep. 22, 2014, which claims the foreign priority benefit under 35 U.S.C. §119 of Japanese Patent Application No. 2013-202221, filed Sep. 27, 2013, the contents of which are incorporated herein by reference.

TECHNICAL FIELD

The present invention relates to a mounting member that is supported by a supporting member by inserting a shaft body thereof into an insertion hole of the supporting member, and to a socket for an electric component having a socket body in which a first electric component is accommodated and which is arranged on a second electric component, and in which the first electric component and the second electric component are electrically connected to each other through contacts arranged on the socket body.

BACKGROUND ART

An IC socket that detachably accommodates an IC package that is a "first electric component" is already available as the present kind of "socket for an electric component". The IC socket is arranged on a wiring substrate as a "second electric component", and has a socket body in which an IC package is accommodated.

As the aforementioned socket body, a component has been proposed that includes a unit body that is arranged on a second electric component and in which through-holes through which contacts are inserted are formed, and a floating plate in which a first electric component is accommodated and which is supported in a vertically movable manner above the unit body (for example, see Japanese Patent Laid-Open No. 2013-134854). The floating plate comprises a plurality of chevron-shaped guide pins that serve to guide the first electric component, the guide pins are erected on a rectangular frame body of the floating plate.

SUMMARY OF INVENTION

Technical Problem

When using the aforementioned guide pins, if a seating property is poor (that is, if the guide pins are mounted to the frame body in a state in which there is a gap at a connecting portion between the frame body and the guide pins), the accuracy at the mounting position will be poor and it will not be possible to carry out positioning of an IC package with high accuracy.

The above described situation is not limited to the guide pins of a socket for an electric component, and similarly applies to a mounting member that is supported by a supporting member by inserting a shaft body thereof into an insertion hole of the supporting member (in particular, a mounting member that is utilized for a use that requires high positional accuracy).

Thus, a first object of the present invention is to provide a mounting member that is capable of improving a seating property and increasing positional accuracy. A second object of the present invention is to provide a socket for an electric component that is capable of improving a seating property of a guide pin with respect to a frame body of a floating plate and increasing the positional accuracy of the guide pin.

Solution to Problem

To achieve the above described objects, a mounting member according to the present invention is a mounting member that is supported by a supporting member, and that has a protruding portion that protrudes from a support face of the supporting member, and a shaft body that is formed thinner than the protruding portion and is inserted into an insertion hole of the supporting member, wherein, at a base portion of the shaft body, a relief recess is formed over an entire circumference of the base portion at a boundary region with the protruding portion, and a supported face of the protruding portion is configured so as to contact the support face of the supporting member in a state in which the mounting member is supported by the supporting member.

Preferably, in the mounting member of the present invention, in the shaft body, a tapered portion is formed that decreases in diameter towards a tip of the shaft body, and a caulking hole is formed along a shaft center of the shaft body in a form that opens at the tip of the shaft body, and the tapered portion is configured so as to contact an inner wall face of the insertion hole as a result of caulking being performed so that the caulking hole expands.

Preferably, the mounting member of the present invention further includes a cylindrical straight portion that is formed between the relief recess and the tapered portion.

Preferably, in the mounting member of the present invention, a processed rounded portion that decreases in diameter towards the tip of the shaft body is formed at a boundary region between the relief recess and the protruding portion, and a maximum diameter of the tapered portion is greater than a maximum diameter of the processed rounded portion.

A socket for an electric component according to the present invention has a socket body in which a first electric component is accommodated and which is arranged on a second electric component, and in which the first electric component and the second electric component are electrically connected to each other through a contact that is arranged on the socket body, wherein: the socket body includes a unit body that is arranged on the second electric component and in which a through-hole through which the contact is inserted is formed and a floating plate on which the first electric component is accommodated and which is supported in a vertically movable manner above the unit body; the floating plate includes a frame body that is a supporting member, and a guide pin; the guide pin has a protruding portion that protrudes from a support face of the supporting member, and a shaft body that is formed thinner than the protruding portion and that is inserted into an insertion hole of the supporting member; and at a base portion of the shaft body, a relief recess is formed over an entire circumference of the base portion at a boundary region with the protruding portion, and a supported face of the protruding portion is configured so as to contact the support face of the supporting member in a state of being supported by the supporting member.

Advantageous Effects of Invention

According to the mounting member of the present invention, since a relief recess is formed in a base portion of a shaft body of the mounting member, even in a case where a processed rounded portion is formed in the base portion of the shaft body because the mounting member is manufactured by cutting processing or the like, at a time that the mounting member is supported by a supporting member, a supported face of a protruding portion of the mounting member contacts against a support face of the supporting member without any space therebetween. It is thus possible to improve a seating property of the mounting member with respect to the supporting member and increase the positional accuracy of the mounting member.

In the mounting member of the present invention, in the shaft body of the mounting member, a tapered portion is formed that decreases in diameter towards the tip thereof, and a caulking hole is formed along a shaft center of the shaft body in a form that opens at the tip of the shaft body. Hence, in addition to facilitating insertion of the shaft body into an insertion hole of the supporting member, when caulking is performed so that the caulking hole of the shaft body of the mounting member expands, the tapered portion of the shaft body contacts an inner wall face of the insertion hole of the supporting member. Consequently, it is difficult for the mounting member to drop out from the supporting member.

In the mounting member of the present invention, by providing a cylindrical straight portion between the relief recess and the tapered portion, insertion of the shaft body of the mounting member into the insertion hole of the supporting member is facilitated.

In the mounting member of the present invention, by making a maximum diameter of the tapered portion greater than a maximum diameter of the processed rounded portion, it is possible to further improve the seating property of the mounting member with respect to the supporting member and increase the positional accuracy of the mounting member.

According to the socket for an electric component of the present invention, in a floating plate, since a relief recess is formed in a base portion of a shaft body of a guide pin, when the guide pin is supported by a frame body, a supported face of a protruding portion of the guide pin contacts against a support face of the frame body without any space therebetween. It is thus possible to improve a seating property of the guide pin with respect to the frame body and increase the positional accuracy of the guide pin. Accordingly, the guide pin can fully fulfil its role as a guide pin, and the first electric component can be positioned with high accuracy by the guide pin.

BRIEF DESCRIPTION OF DRAWINGS

FIGS. 1A and 1B are multi-view drawings illustrating a unit of an IC socket according to an embodiment of the present invention, in which FIG. 1A is a plan view thereof, and FIG. 1B is a cross-sectional view along a line A-A in (a).

FIGS. 2A and 2B are multi-view drawings illustrating a guide pin of the unit of the IC socket according to the same embodiment, in which FIG. 2A is a front view thereof, and FIG. 2B is a bottom view thereof.

FIGS. 4A and 4B are multi-view drawings illustrating a guide pin according to a comparative example, in which FIG. 4A is a front view thereof, and FIG. 4B is a bottom view thereof.

FIGS. 5A and 5B are multi-view drawings in which FIGS. 5A and 5B are both partial cross-sectional views illustrating a state at a time of insertion of the guide pin illustrated in FIGS. 4A and 4B.

DESCRIPTION OF EMBODIMENT

Comparative Example

Figure 1:
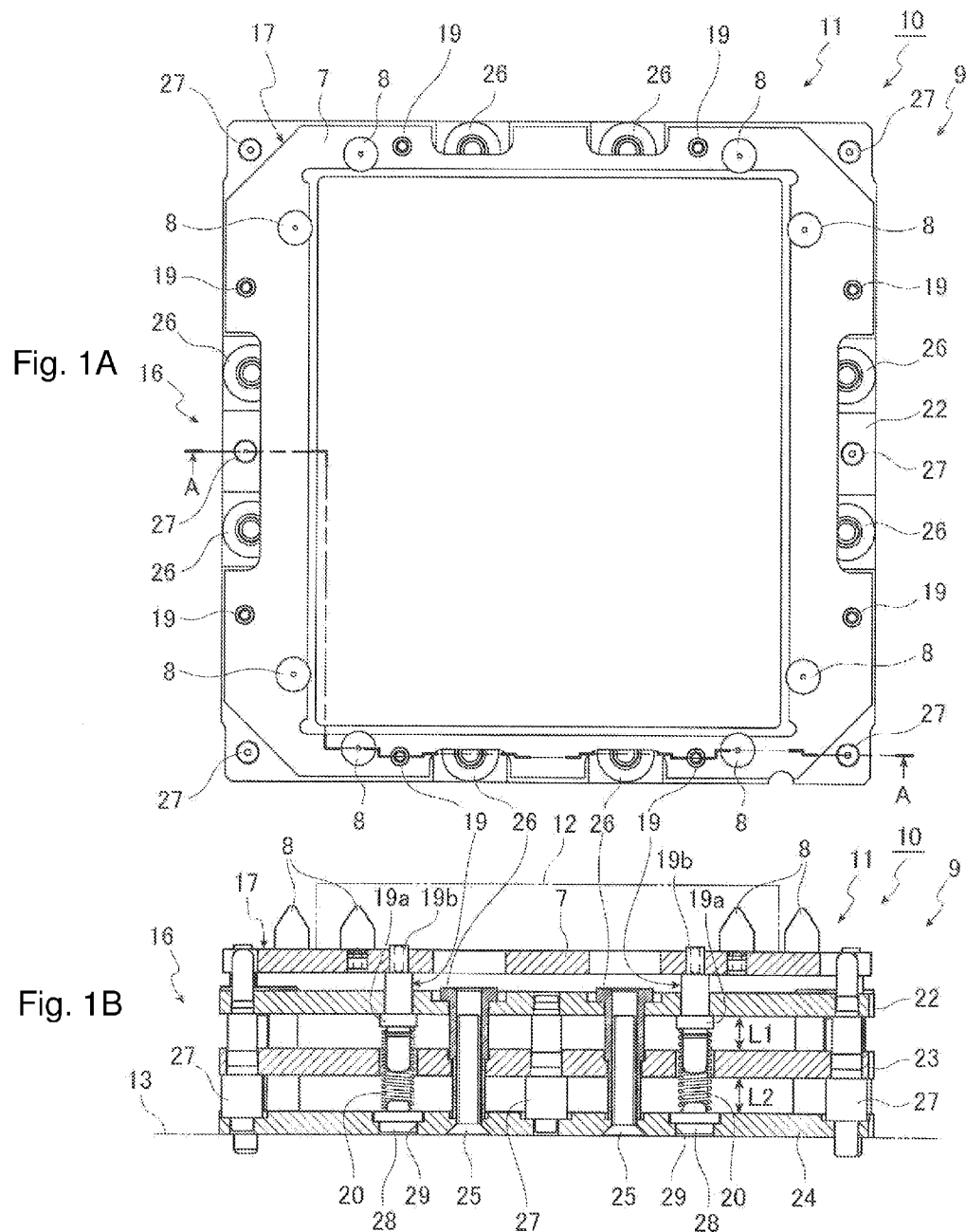

First, a guide pin according to a comparative example will be described using FIGS. 4A and 4B and FIGS. 5A and 5B.

As shown in FIGS. 4A and 4B, a guide pin 8 of the comparative example has a structure in which a substantially truncated cone-shaped protruding portion 81 and a substantially cylindrical shaft body 82 that is thinner than the protruding portion 81 are integrally formed. Because this kind of guide pin 8 is generally manufactured by cutting processing, a processed rounded portion 6 remains over the entire circumference of a base portion 82a of the shaft body 82.

As a result, as shown in FIGS. 5A and 5B, during assembly of a floating plate 17, when inserting (press fitting) the shaft body 82 of the guide pin 8 into an insertion hole 71 of a frame body 7, in some cases, as shown in FIG. 5A, a supported face 81a of the protruding portion 81 of the guide pin 8 floats over the support face 72 of the frame body 7, or as shown in FIG. 5B, the supported face 81a of the protruding portion 81 of the guide pin 8 inclines relative to the support face 72 of the frame body 7. In such cases, a seating property of the guide pin 8 with respect to the frame body 7 deteriorates and the positional accuracy of the guide pin 8 decreases, and the guide pin 8 cannot fully fulfill its role as a guide pin, and there thus is a risk that the first electric component cannot be positioned with high accuracy.

Embodiment of the Invention

Hereunder, an embodiment of the present invention will be described.

FIGS. 1A, 1B, 2A, 2B, 3A and 3B illustrate an embodiment of the present invention.

Firstly, the configuration of the present embodiment will be described. An IC socket 10 as a "socket for an electric component" is arranged on a wiring substrate 13 as a "second electric component" in order to electrically connect an IC package 12 as a "first electric component" and the wiring substrate 13 for the purpose of performing a burn-in test or the like of the IC package 12. The IC socket 10 includes a socket body 9 in which the IC package 12 is accommodated and which is arranged on the wiring substrate 13, and an unshown pressing mechanism that presses the IC package 12 on the socket body 9 downward.

The socket body 9 includes an unshown frame body, and a unit (contact module) 11 that is supported within the frame body.

As shown in FIGS. 1A and 1B, the unit 11 includes: a unit body 16 that is arranged on the wiring substrate 13, and in which a large number of unshown through-holes are formed through which unshown contacts (contact pins) are inserted; a floating plate 17 on which the IC package 12 is accommodated and which is supported in a vertically movable manner above the unit body 16; a plurality of rivets 19 that are attached to the floating plate 17 and are supported in a vertically movable manner by the unit body 16, and guide a vertical movement of the floating plate 17; and a plurality of springs 20 that are provided below the rivets 19 and that urge the floating plate 17 upward via the rivets 19. A plurality of insertion holes 29 of a size that allows the respective springs 20 and rivets 19 to be inserted therethrough in the vertical direction (vertical direction in FIG. 1B) are formed in the unit body 16. In addition, a plurality of stepped, disc-shaped spring bearing members 28 that receive the springs 20 are detachably provided in the insertion holes 29.

More specifically, as shown in FIGS. 1A and 1B, the unit body 16 includes an upper-side plate 22, a center plate 23 and a lower-side plate 24 and the like. A plurality of stepped cylindrical spacers 27 are fitted to each of the three plates 22, 23 and 24. The three plates 22, 23 and 24 are fixed together integrally in a state in which predetermined intervals L1 and L2 are maintained therebetween by screwing, from the undersurface of the lower-side plate 24, a corresponding number of bolts 25 into a plurality of sleeves 26 that are fitted into the upper-side plate 22 and the center plate 23.

Further, as shown in FIGS. 1A and 1B, upper end portions 19*b* of eight rivets 19 are fixedly attached to the floating plate 17, and these rivets 19 penetrate through the upper-side plate 22 and are slidably attached in the vertical direction. Respective flange portions 19*a* are formed in the vicinity of the lower portion of each rivet 19 so as to regulate the most elevated position of the floating plate 17 by contacting against the undersurface of the upper-side plate 22. In addition, between the flange portion 19*a* of each rivet 19 and the lower-side plate 24, respective springs 20 are arranged so as to resiliently urge the corresponding rivets 19 upward, that is, towards the floating plate 17 side.

As shown in FIGS. 1A and 1B, the floating plate 17 is supported in a vertically movable manner above the upper-side plate 22. The floating plate 17 has a rectangular frame body 7 as a "supporting member", and eight chevron-shaped guide pins 8 as "mounting members" made of stainless steel are vertically arranged on the frame body 7.

Figure 2:
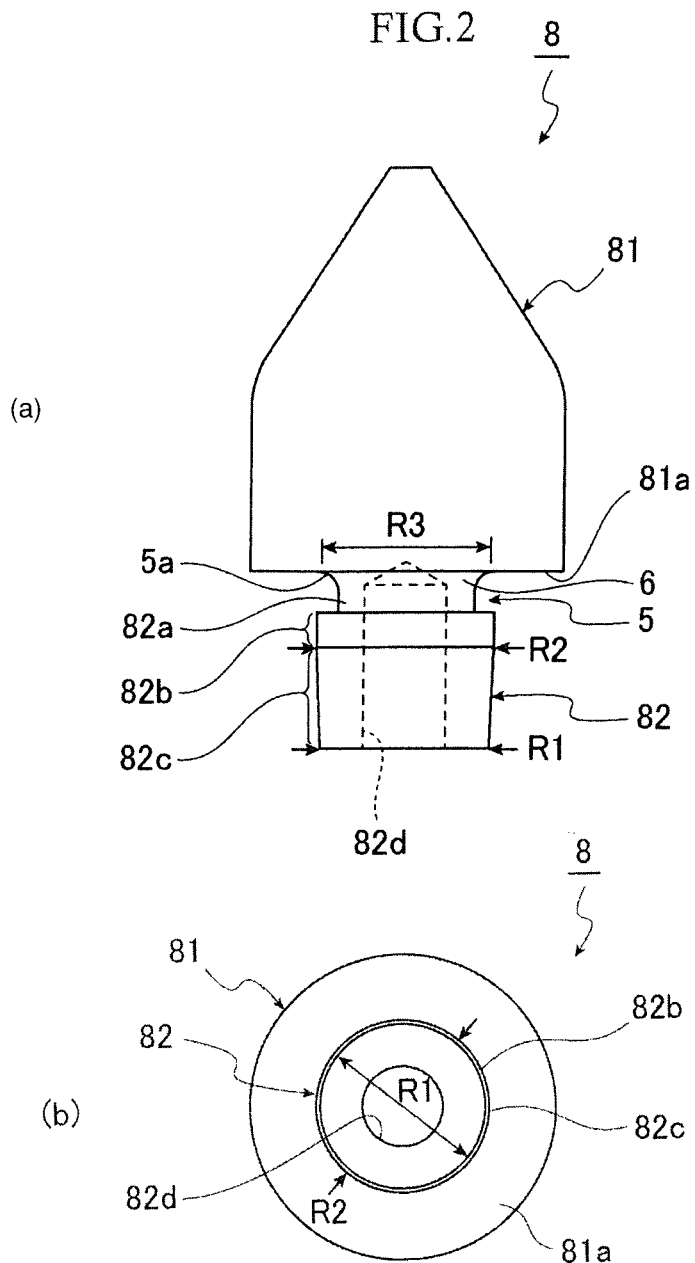

As shown in FIGS. 2A and 2B, each guide pin 8 has a structure in which a substantially truncated cone-shaped protruding portion 81 and a substantially cylindrical shaft body 82 that is thinner than the protruding portion 81 are integrally formed. The shaft body 82 has a substantially ring-shaped relief recess 5 that is formed over the entire circumference of a base portion 82*a* that is located at a boundary region with the protruding portion 81, a cylindrical straight portion 82*b*, and a truncated cone-shaped tapered portion 82*c*.

As shown in FIG. 2A, the relief recess 5 is formed with a smaller diameter than the straight portion 82*b*, with a diameter R3 of a foot portion 5*a* (that is, a portion at which the diameter is largest) of the relief recess 5 being less than a diameter R2 of the straight portion 82*b*. The tapered portion 82*c* is formed in a tapering shape that decreases in diameter towards a tip (lower end in FIG. 2A) of the shaft body 82. That is, in the tapered portion 82*c*, the diameter of a base portion (that is, a portion at which the diameter is largest) matches the diameter R2 of the straight portion 82*b*, and a diameter R1 of the tip portion is less than the diameter of the base portion of the tapered portion 82*c*. In addition, in the shaft body 82, a caulking hole 82*d* that has a circular cross-section is formed along a shaft center of the shaft body 82 in a form that opens at the tip of the shaft body 82. Note that, to enable light press-fitting of the shaft body 82 of the guide pin 8 into the insertion hole 71 of the frame body 7 when assembling the floating plate 17, the diameter of the straight portion 82*b* of the shaft body 82 is slightly smaller than the diameter of the insertion hole 71.

Figure 3A:
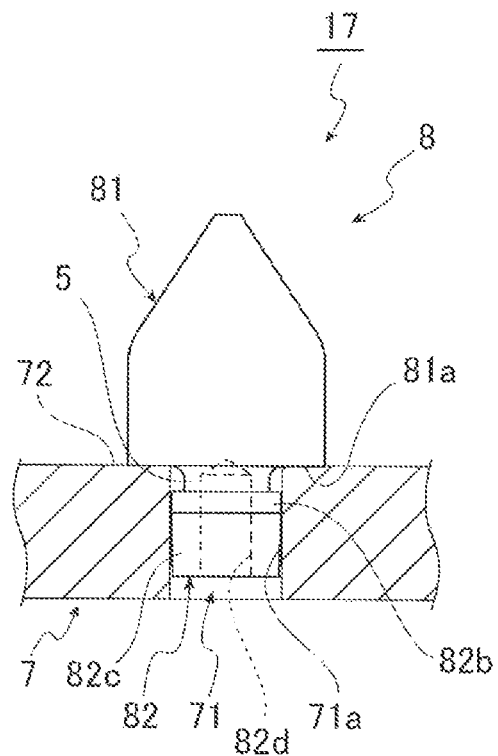
FIGS. 3A and 3B are multi-view drawings that include partial cross-sectional views illustrating a state at a time of insertion of the guide pin illustrated in FIGS. 2A and 2B.
Figure 3B:
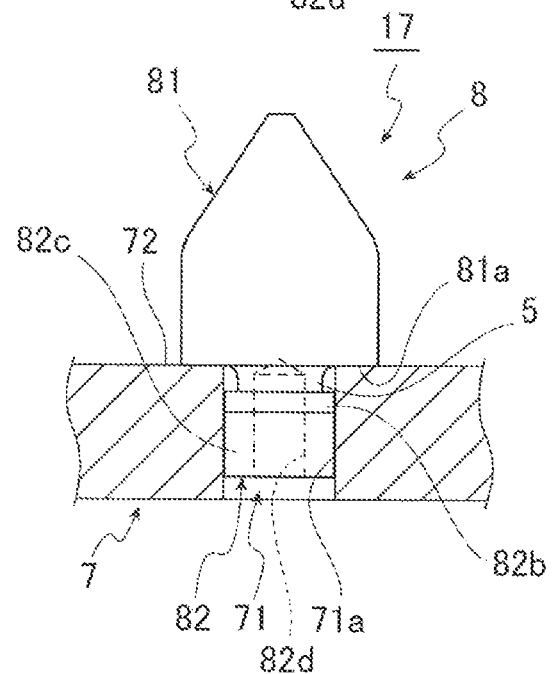

In the floating plate 17, since the relief recess 5 is formed in the base portion 82*a* of the shaft body 82 of the respective guide pins 8, even in a case where a processed rounded portion 6 (see FIGS. 4A and 4B) is formed in the base portion 82*a* of the shaft body 82 because the guide pins 8 are manufactured by cutting processing or the like, as shown in FIG. 3A, when the guide pin 8 is supported by the frame body 7, the supported face 81*a* of the protruding portion 81 of the guide pin 8 contacts against the support face 72 of the frame body 7 without any space therebetween.

Further, since the shaft body 82 of the guide pin 8 includes the tapered portion 82*c* formed that decreases in diameter towards the tip thereof and also the caulking hole 82*d* that is formed along the shaft center of the shaft body 82 in a form that opens at the tip of the shaft body 82. Therefore, in addition to facilitating insertion of the shaft body 82 into the insertion hole 71 of the frame body 7, as shown in FIG. 3(*b*), when caulking is performed so that the caulking hole 82*d* of the shaft body 82 of the guide pin 8 expands, the tapered portion 82*c* of the shaft body 82 contacts an inner wall face 71*a* of the insertion hole 71 of the frame body 7. Consequently, it is difficult for the guide pin 8 to drop out from the frame body 7. Note that, although, for example, a method that inserts a caulking pin into the caulking hole 82*d* or a method that changes the shape of the tapered portion 82*c* so that the caulking hole 82*d* expands by using a caulking jig are available as a method for caulking the guide pin 8 (that is, a method for expanding the caulking hole 82*d*), another method may also be used.

In addition, as described above, since the shaft body 82 of the guide pin 8 includes the cylindrical straight portion 82*b*, when assembling the floating plate 17, stability can be secured when inserting the shaft body 82 of the guide pin 8 into the insertion hole 71 of the frame body 7. Further, since the guide pin 8 can be firmly fixed to the frame body 7 by caulking the tapered portion 82*c*, insertion of the straight portion 82*b* into the insertion hole 71 can be performed by light press-fitting, and in this respect also stability can be secured when inserting (lightly press-fitting) the shaft body 82 of the guide pin 8 into the insertion hole 71 of the frame body 7.

Next, a method for using the IC socket 10 is described.

First, the IC socket 10 is arranged on the wiring substrate 13. Thereupon, the unit 11 ascends against an urging force of an unshown spring of an unshown contact in a form in which a plunger of the contact is pushed upward by the wiring substrate 13, and a state is entered in which the bottom end of the plunger and an unshown electrode of the wiring substrate 13 contact with a predetermined contact pressure.

Thereafter, in a state in which the floating plate 17 is at the most elevated position thereof, the IC package 12 is received onto the floating plate 17. Thereupon, the IC package 12 is guided by the guide pins 8 of the floating plate 17, and thereafter enters a state in which a peripheral portion thereof is supported by the frame body 7 of the floating plate 17.

At this time, as described above, on the floating plate 17, since the supported face 81*a* of the protruding portion 81 of the respective guide pins 8 contacts against the support face 72 of the frame body 7 without any space therebetween, it is possible to improve the seating property of the guide pins 8 with respect to the frame body 7 and increase the positional accuracy of the guide pins 8. Accordingly, the role of the guide pins 8 (that is, role of guiding the IC package 12) can be fully fulfilled and the IC package 12 can be positioned with high accuracy by the guide pins 8.

Note that, although it is also conceivable to provide recesses on the frame body 7 side to improve the seating property of the guide pins 8 with respect to the frame body 7, in such a case the contact area between the support face 72 of the frame body 7 and the supported face 81a of the guide pin 8 will decrease, and there will be the disadvantage that the support of the guide pins 8 will become unstable by a corresponding amount. In this respect, in the present embodiment, because the relief recess 5 is provided on the guide pins 8 side and not on the frame body 7 side, it is possible to improve the seating property of the guide pins 8 without the above described disadvantage.

Finally, the IC package 12 that is on the floating plate 17 is pressed downward by the unshown pressing mechanism of the IC socket 10. Thereupon, the floating plate 17 descends towards the lowermost position thereof together with the IC package 12 and the rivets 19. As a result, in the IC socket 10, a barrel of an unshown contact descends against an urging force of the unshown spring of the contact in a form in which the barrel is pushed downward by the IC package 12, and a state is entered in which an upper end portion of the barrel and an unshown terminal of the IC package 12 contact with a predetermined contact pressure. Accordingly, a state is entered in which the terminal of the IC package 12 and the electrode of the wiring substrate 13 electrically conduct with each other through the unshown contact.

At this time, as described above, since the IC package 12 is positioned with high accuracy by the guide pins 8 of the floating plate 17, it is possible to reliably cause the terminal of the IC package 12 and the electrode of the wiring substrate 13 to electrically conduct with each other without a positional deviation in the lateral direction arising between the upper end portion of the barrel of the unshown contact and the unshown terminal of the IC package 12.

In this state, a current is passed through the IC package 12 to perform a burn-in test or the like.

Note that, in the above described embodiment, although the guide pins 8 in which the protruding portion 81 is a substantially truncated conical shape and the shaft body 82 is substantially cylindrical are described, the shape of the protruding portion 81 and the shaft body 82 is not particularly limited. For example, the present invention can also be applied to guide pins 8 having a prism-shaped shaft body 82.

Further, the present invention is not limited to the IC socket 10 described in the above embodiment, and naturally the present invention can also be applied to other types of sockets.

Further, although in the above described embodiment the present invention is applied to the IC socket 10 as a "socket for an electric component", the present invention is not limited thereto and naturally can also be applied to other devices.

Further, although in the above described embodiment the present invention is applied to the guide pins 8 of the floating plate 17, the present invention is not limited to the guide pins 8, and it is possible to achieve a similar effect, that is, an effect of improving the seating property of a mounting member with respect to a supporting member and increasing the positional accuracy, by applying the present invention to a mounting member (for example, the rivets 19 that are attached to the floating plate 17, or the spacers 27 that are fitted to the plates 22, 23 and 24) whose shaft body is inserted into an insertion hole of a supporting member (corresponds to the frame body 7) and is supported by a supporting member.

REFERENCE SIGNS LIST

5 Relief recess
5a Foot portion
6 Processed rounded portion
7 Frame body (supporting member)
8 Guide pin (mounting member)
9 Socket body
10 IC socket (socket for an electric component)
11 Unit
12 IC package (first electric component)
13 Wiring substrate (second electric component)
16 Unit body
17 Floating plate
71 Insertion hole
71a Inner wall face
72 Support face
81 Protruding portion
81a Supported face
82 Shaft body
82a Base portion
82b Straight portion
82c Tapered portion
82d Caulking hole

The invention claimed is:

1. A mounting member that is supported by a supporting member, comprising:
   a protruding portion that has a planate supported face; and
   a shaft body that is protruded from a central portion of the supported face and is inserted into an insertion hole formed on a support face of the supporting member;
   wherein the shaft body comprises:
      a main shaft body having a diameter so as to be pressed into the insertion hole of the supporting member, and
      a base portion formed between the main shaft body and the supported face of the protruding portion, the base portion being smaller in diameter than the main shaft body,
   a processed rounded portion that decreases in diameter towards a tip of the shaft body is formed at a boundary region between the base portion and the supported face of the protruding portion, and
   the main shaft body and the insertion hole of the supporting member are larger in diameter than the processed rounded portion, such that when the shaft body is inserted into the insertion hole, the supported face of the protruding portion contacts with the support face of the supporting member and the processed rounded portion does not contact with the support face of the supporting member.

2. The mounting member according to claim 1, wherein, in the main shaft body, a tapered portion is formed that decreases in diameter towards the tip of the shaft body, and a caulking hole is formed along a shaft center of the shaft body in a form that opens at the tip of the shaft body, and the tapered portion is configured so as to contact an inner wall face of the insertion hole as a result of caulking being performed so that the caulking hole expands.

3. The mounting member according to claim 2, wherein the main shaft body further comprises a cylindrical straight portion that is formed between the base portion and the tapered portion.

4. A socket for an electric component having a socket body in which a first electric component is accommodated and which is arranged on a second electric component, and in which the first electric component and the second electric component are electrically connected to each other through a contact that is arranged on the socket body, wherein:
   the socket body comprises a unit body that is arranged on the second electric component and in which a through-hole through which the contact is inserted is formed, and a floating plate on which the first electric component is accommodated and which is supported in a vertically movable manner above the unit body;

the floating plate comprises a frame body that is a supporting member, and a guide pin;

the guide pin having:

a protruding portion that has a planate supported face, and a shaft body that is protruded from a central portion of the supported face and is inserted into an insertion hole formed on a support face of the supporting member; and wherein the shaft body comprises:

a main shaft body having a diameter so as to be pressed into the insertion hole of the supporting member, and a base portion formed between the main shaft body and the supported face of the protruding portion, the base portion being smaller in diameter than the main shaft body, a processed rounded portion that decreases in diameter towards a tip of the shaft body is formed at a boundary region between the base portion and the supported face of the protruding portion, and the main shaft body and the insertion hole of the supporting member are larger in diameter than the processed rounded portion, such that when the shaft body is inserted into the insertion hole, the supported face of the protruding portion contacts with the support face of the supporting member and the processed rounded portion does not contact with the support face of the supporting member.

* * * * *